United States Patent [19]

Metz et al.

[11] Patent Number: 4,859,561
[45] Date of Patent: Aug. 22, 1989

[54] DEVELOPER SHEET USEFUL IN PROVIDING TRANSPARENCIES OR REPRODUCTIONS HAVING A CONTROLLED GLOSS FINISH

[75] Inventors: George D. Metz, Mayfield Heights; Carl McCrary, West Carrollton; Joseph G. O'Connor; Paul C. Adair, both of Springboro; D. Scott Proehl, Miamisburg; Edward J. Saccocio, Columbus; James Dowler, Franklin, all of Ohio

[73] Assignee: The Mead Corporation, Dayton, Ohio

[21] Appl. No.: 73,036

[22] Filed: Jul. 14, 1987

Related U.S. Application Data

[63] Continuation-in-part of Ser. No. 905,727, Sep. 9, 1986, abandoned.

[51] Int. Cl.$^4$ .............. G03C 1/72; B41M 5/16; B41M 5/22
[52] U.S. Cl. ................... 430/138; 430/211; 430/350; 428/327; 503/207; 503/214
[58] Field of Search ............ 430/138, 211, 350, 961; 346/207, 214; 428/327

[56] References Cited

U.S. PATENT DOCUMENTS

| | | | |
|---|---|---|---|
| 3,016,308 | 1/1962 | Macaulay et al. | 346/214 |
| 3,170,809 | 2/1965 | Barbour et al. | 428/488.1 |
| 3,455,721 | 7/1969 | Phillip et al. | 346/204 |
| 3,466,184 | 9/1969 | Bowler et al. | 428/537.5 |
| 3,617,410 | 11/1971 | Clark . | |
| 3,672,935 | 6/1972 | Miller et al. | 428/530 |
| 3,924,027 | 12/1975 | Saito et al. | 427/147 |
| 4,199,619 | 4/1980 | Oda et al. | 427/150 |
| 4,399,209 | 8/1983 | Sanders et al. | 430/138 |
| 4,416,966 | 11/1983 | Sanders et al. | 430/138 |
| 4,422,670 | 12/1983 | Hasegawa et al. | 428/327 |
| 4,440,846 | 4/1984 | Sanders et al. | 430/138 |
| 4,461,495 | 7/1984 | Nakasato et al. | 346/211 |
| 4,470,058 | 9/1984 | Bodmer | 346/212 |
| 4,554,235 | 11/1985 | Adair et al. | 430/138 |
| 4,578,339 | 3/1986 | Adkins | 430/138 |
| 4,596,996 | 6/1986 | Sandberg et al. | 346/207 |
| 4,647,952 | 3/1987 | Pokora et al. | 346/210 |

Primary Examiner—Paul R. Michl
Assistant Examiner—Patrick A. Doody
Attorney, Agent, or Firm—Smith & Schnacke

[57] ABSTRACT

A developer sheet useful in forming reproductions which have a controllable gloss finish or in forming transparencies comprising a support having a layer of a finely divided, thermoplastic, developer material on the surface thereof, said developer material being capable of reacting with a color precursor to produce a visible image and being capable of coalescing into a thin film which imparts gloss to said image upon application of heat and/or pressure.

The developer sheet comprising a support having a layer of a finely divided thermoplastic developer material on the surface thereof can additionally comprise oil-containing microcapsules such that upon microcapsule rupture, the oil plasticizes the developer material.

27 Claims, 2 Drawing Sheets

DEVELOPER SHEET USEFUL IN PROVIDING TRANSPARENCIES OR REPRODUCTIONS HAVING A CONTROLLED GLOSS FINISH

CROSS-REFERENCE TO RELATED APPLICATIONS

This application is a continuation-in-part of U.S. application Ser. No. 905,727, filed Sept. 9, 1986.

BACKGROUND OF THE INVENTION

The present invention relates to a developer sheet which is useful in providing visible images through reaction with a color precursor and which is useful in providing transparencies or in providing reproductions having a glossy finish. It more particularly relates to a developer sheet which is capable of providing a controlled degree of gloss ranging from matte to high gloss.

The developer sheet of the present invention can be used in conjunction with conventional pressure-sensitive copy paper or photosensitive imaging systems employing microcapsules to provide visible images upon contact with a color precursor which is image-wise released from the microcapsules and transferred to the developing sheet.

Pressure-sensitive copy paper is well known in the art. It is described in U.S. Pat. Nos. 2,550,466; 2,712,507; 2,730,456; 3,016,308; 3,170,809; 3,455,721; 3,466,184; 3,672,935; 3,955,025; and 3,981,523.

Photosensitive imaging systems employing microencapsulated radiation sensitive compositions are the subject of commonly assigned U.S. Pat. Nos. 4,399,209 and 4,416,966 to The Mead Corporation as well as copending U.S. Pat. application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. Exposure image-wise hardens the internal phase of the microcapsules. Following exposure, the imaging sheet is subjected to an uniform rupturing force by passing the sheet through the nip between a pair of pressure rollers.

U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules rupture and image-wise release the internal phase whereupon the color former migrates to the developer sheet where it reacts with a dry developer and forms a color image. The imaging system can be designed to reproduce monochromatic or polychromatic full color images.

Commonly assigned U.S. Pat. No. 4,578,339 discloses oil-containing microcapsules on the imaging sheet and/or the developer sheet. The function of the dyeless microcapsules is to release an oil which mixes with the internal phase released from the photosensitive microcapsules to reduce its viscosity and thereby increase the mobility of the chromogenic material. As a result, the interaction between the developer material and the chromogenic material on the developer sheet is improved. While the reference discloses numerous examples of color developers, they are not all useful in the present invention because they are not necessarily designed to film out upon the application of heat.

In those applications in which the aforementioned pressure-sensitive and photosensitive imaging systems are used to reproduce graphic or picture images, a high degree of gloss is often desired in the reproduction. In particular, where a transparency is desired, the reproduction must transmit light effectively. These objectives are difficult to achieve using conventional approaches. Because the reaction between the developer and the color former occurs principally at the surface of the developer, finely divided developers such as resin grinds are the developer of choice because they provide a large reactive surface area to react with the color former and provide high optical density. However, these compositions usually contain fine dispersing agents or pigments which scatter light and make the image appear dull.

One technique which has been used previously to produce high gloss images is described in U.S. Pat. No. 4,554,235. There, the developer layer is overcoated with a discontinuous layer of a thermoplastic polymeric pigment. After exposure, the imaging sheet is assembled with the developer sheet and subjected to pressure. The color former is released from the microcapsules, passes through the layer of polymeric pigment, and reacts with the developer. Thereafter, the thermoplastic pigment is subjected to heat and/or pressure which causes the pigment to coalesce into a transparent continuous thin film which imparts a glossy finish to the image.

SUMMARY OF THE INVENTION

In accordance with the present invention, a glossy finish is obtained using a developer sheet which carries a layer of a finely divided thermoplastic developer material which layer can be coalesced into a thin continuous film after development. The non-reactive film forming resin of U.S. Pat. No. 4,554,235 is obviated. If a transparent support is used, a transparency is obtained.

It has been found that certain thermoplastic resins and other developer materials are capable of reacting with a color precursor to produce a visible image and subsequently can be coalesced into a continuous film. This film is essentially transparent. It imparts a gloss finish when the image is formed on an opaque background and it transmits light efficiently when the image is formed on a transparent background to provide a transparency. Furthermore, the degree of gloss can be adjusted by controlling the coalescence conditions (e.g. heat treatment). Thus, by limiting coalescence, finishes ranging from matte to high gloss (20% to 90% gloss) can also be provided.

In accordance with one embodiment of the present invention, the developer materials are film forming, thermoplastic, phenolic resins (e.g., phenol-formaldehyde resins). These resins are provided on a support as finely divided particles which usually range from about 0.1 to 25 microns in particle size. The developer sheet is used in a conventional manner except, after or simultaneously with development, the developer particles are subjected to heat and/or pressure which causes them to coalesce into a film.

Thus, one embodiment of the present invention resides in a developer sheet comprising a support having a layer of a finely divided developer material on the surface thereof, wherein the developer material is thermoplastic and is capable of reacting with a color precursor, such as a substantially colorless electron donating compound to form a visible image and being coalesced into a film.

Another embodiment of the invention is a process for forming images which comprises image-wise transferring a color precursor to the surface of a developer sheet comprising a support having a layer of a finely divided developer material on the surface thereof, said developer material being thermoplastic and being capable of reacting with said color precursor and producing a visible image; and subsequently coalescing said developer into a film.

A further embodiment of the present invention is a developer sheet which is useful in forming transparencies wherein the aforementioned finely divided, thermoplastic developer resin is provided on a transparent support.

Another embodiment of the present invention resides in a developer sheet comprising a support having a layer of a finely divided developer material on the surface thereof and oil-containing microcapsules wherein the developer material is thermoplastic and is capable of reacting with a color precursor such as a substantially colorless electron donating compound to form a visible image and being coalesced into a film. The oil of the oil-containing microcapsules is capable of plasticizing the developer material.

Thermoplastic developer materials are also useful in self-contained systems in which the image is viewed through a transparent support against a white background.

In accordance with still another embodiment of the invention, the developers of the present invention are used to record microfiche or microfilm images.

DETAILED DESCRIPTION OF THE INVENTION

Figure 1:
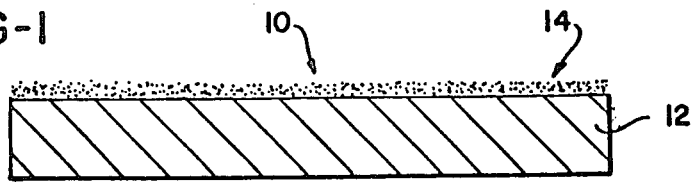
FIG. 1 is a cross-sectional schematic view of a developer sheet in accordance with the present invention.

A developer sheet in accordance with the present invention is schematically shown in FIG. 1 wherein the developer sheet is designated generally by the reference numeral 10. The sheet 10 includes a support 12 which is overcoated by a layer 14 of a finely divided thermoplastic developer material. The layer 14 may consist of developer material or be an admixture of the developer material with a binder which adheres the developer material to the support. Preferably, the developer material adheres to the support without a binder. The support 12 may be paper or a transparent film such as polyethylene terephthalate.

Upon image-wise transfer of a color precursor to the surface of sheet 10, a visible image is formed in layer 14 as shown by the cross-hatching 16. The visible image is usually the product of an acid-base reaction between the color precursor, which is usually an electron donor, and the developer, which is usually an electron acceptor.

After developing the image 16, the developer sheet is subjected to heat and/or pressure to coalesce the developer material. Depending on the processing conditions which are used (more particularly the amount of heat and pressure applied), degrees of gloss ranging from matte to low gloss to high gloss can be obtained.

Figure 2:
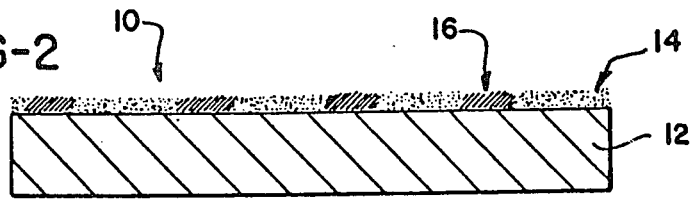
FIG. 2 is a view of the developer sheet of FIG. 1 after image-wise transfer of the color precursor thereto.
Figure 3:
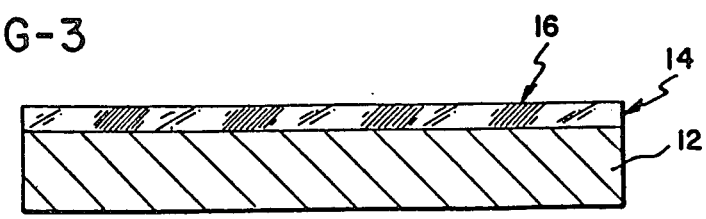
FIG. 3 is a view of the developer sheet of FIG. 2 after coalescence of the developer resin to provide a high gloss finish.
Figure 4:
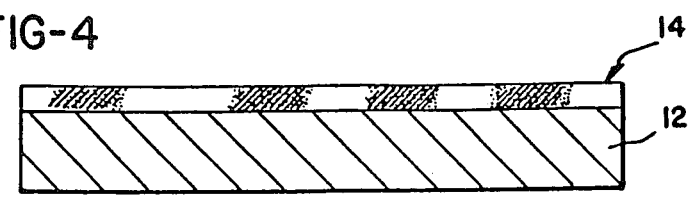
FIG. 4 is a view of the developer sheet of FIG. 2 after coalescence to provide a matte finish.

FIG. 3 schematically illustrates a high gloss finish. The developer 14 is essentially completely coalesced into a thin, continuous, translucent film. An intermediate degree of gloss is schematically shown in FIG. 4 in which partial coalescence of the layer 14 gives a finish which is glossier than the uncoalesced intermediate of FIG. 2 but less glossy than the finish of FIG. 3. Where the developer sheet is to be used as a transparency, the support film is transparent and complete coalescence of the developer resin is used.

Figure 5:
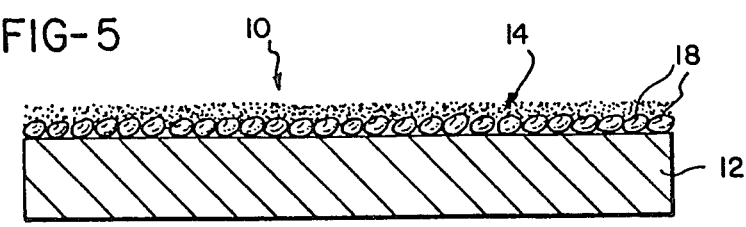
FIG. 5 is a cross-sectional schematic view of a developer sheet in accordance with another embodiment of the present invention.
Figure 6:
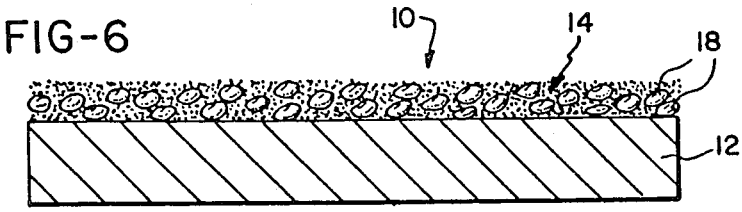
FIG. 6 is a cross-sectional schematic view of a developer sheet in accordance with another embodiment of the present invention.

In FIG. 5, the developer sheet 10 includes a support 12 which is overcoated by a layer of oil-containing microcapsules 18 and a layer of a finely divided thermoplastic developer material 14. In FIG. 6, the developer sheet 10 includes a support 12 which is overcoated by a dispersion of the oil-containing microcapsules 18 and the finely divided thermoplastic developer material 14. Although not illustrated, it should be understood that when the developer sheet 10 is used with an imaging sheet, the oil-containing microcapsules 18 can be present on the surface of the imaging sheet instead of on the surface of the developer sheet 10.

The principal function of the microencapsulated oil is to reduce the amount of the heat and time required during the coalescing step to cause the developer resin 14 to melt and to provide a more uniform gloss. In the past, high density image regions have tended to gloss more quickly due to the oil present than low density image regions. By incorporating the microencapsulated oil either in the developer layer of the developer sheet 10 or on the surface of the imaging sheet, the oil serves to plasticize the developer resin and accelerate film formation.

Figure 7:
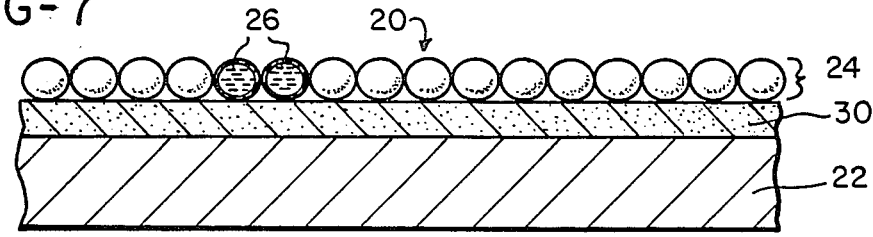
FIG. 7 is a cross-sectional view of a self-contained imaging sheet in accordance with the present invention.

Coalescable thermoplastic developer resins are also useful in self-contained imaging systems of the type described in U.S. Pat. No. 4,440,846. An example is provided in FIG. 7. Therein a self-contained imaging sheet 20 is shown. The imaging sheet 20 includes a substrate 22 coated with a layer of microcapsules 24. The microcapsules are filled with an internal phase 26 containing a chromogenic material and a photosensitive composition. Interposed between the layer of microcapsules 24 and the substrate 22 is a layer of the coalescable developer resin 30. The imaging sheet 20 may be image-wise exposed from side 42 carrying the layer of microcapsules 34.

It is particularly desirable to form substrate 22 from a transparent film. In this case, the imaging material may be image-wise exposed to actinic radiation from either side 42 or side 44. Typically, the imaging material is exposed from side 42 and viewed from side 44.

Figure 8:
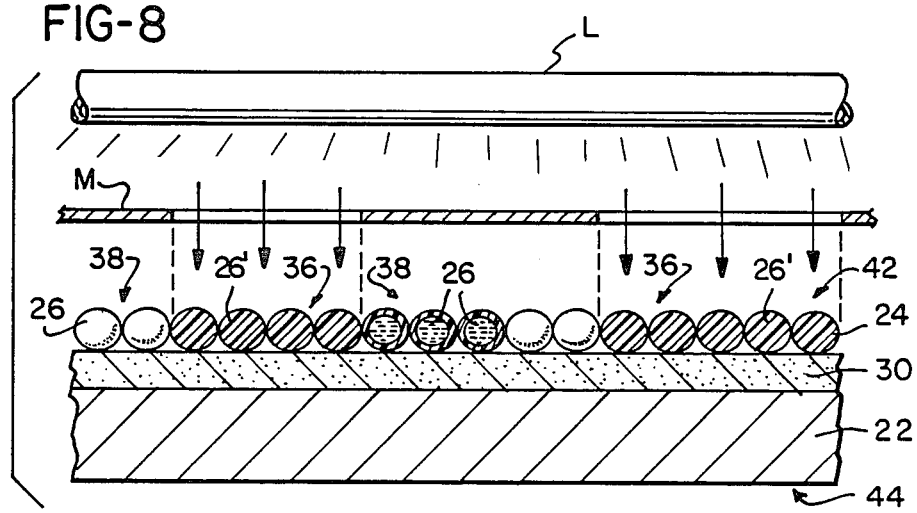
FIGS. 8-10 are cross-sectional views illustrating exposure and development processing of a self-contained imaging sheet in accordance with the invention.
Figure 9:
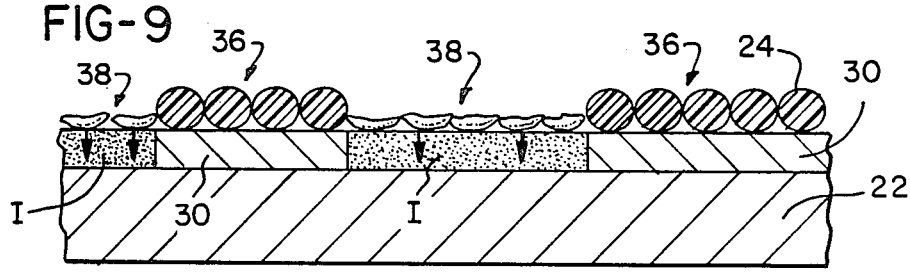

Image-wise exposure of the imaging material 20 by transmission imaging is shown in FIG. 8 wherein a source of radiation-L is positioned above the surface of the imaging sheet 20 with a Mask M therebetween. In this illustration, the photosensitive material is a radiation curable material and hence, the imaging material is positive working. Exposure solidifies the internal phase 26 in the exposed areas 36 whereas the internal phase 26 remains liquid in the unexposed areas 38. FIG. 9 illustrates the imaging sheet 20 after the microcapsules have been ruptured. For simplification, the microcapsules are shown as being ruptured in the unexposed areas 38 and unruptured in the exposed areas 36. In actuality, all or a portion of the microcapsules may also rupture in area 36 and there will be areas of intermediate exposure in which all or a portion of the capsules may also be ruptured. In unexposed areas 38, the chromogenic material and the developer react to form a visible image I. Upon heating the imaging material 20, the developer layer 30 becomes essentially transparent as shown in FIG. 9.

Figure 10:
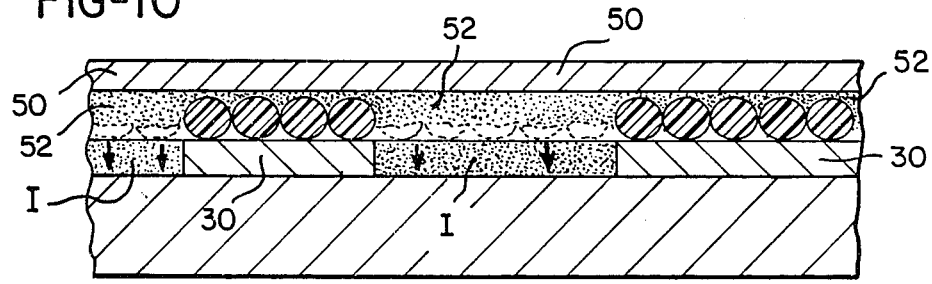

After exposure, development and coalescence of the developer 30, the image can be viewed. If the substrate 22 is opaque, the image is viewed from side 42. On the other hand, if substrate 22 is transparent, the image can be viewed from side 44. When substrate 22 is transparent, it is particularly desirable to laminate the self-contained material 20 to a sheet of plain paper or a similar material providing a white background. This is illustrated in FIG. 10 wherein the developed imaging material from FIG. 9 is shown laminated to a sheet of plain paper 50 by means of a transparent adhesive 52. In this manner, the paper or similar material provides a white background against which the image I can be viewed.

Typically, the microcapsules are ruptured by passing the imaging sheet alone (in the case of a self-contained material) or in combination with a developer sheet (in the case of a transfer material), through a pair of pressure rollers. In addition to pressure, however, a magnetic brush as described in U.S. Pat. No. 4,592,986 or free particles as described in U.S. Pat. No. 4,578,340 maybe used.

The developer materials used in the present invention are finely divided thermoplastics. Their softening points typically range from about 100° to 200° C., but those skilled in the art will appreciate that materials with higher and lower softening points may also be useful. The particle size is preferably in the range of about 0.5 to 25 microns.

A typical example of a thermoplastic developer material useful in the present invention is phenolic resins. Phenolic resins have been conventionally used as developer materials in pressure-sensitive recording materials. These resins may be the condensation product of phenols (including substituted phenols) and formaldehyde. The resins may be further modified to include amounts of salicylic acids or substituted salicylic acids in a manner known in the art. Examples of phenolic resins useful in the present invention are described in U.S. Pat. Nos. 3,455,721; 3,466,184; 3,672,935; 4,025,490; and 4,226,962. Another class of phenolic resin useful in the present invention is the products of oxidative coupling of substituted or unsubstituted phenols or biphenols. Oxidative coupling may be catalyzed by various catalysts but a particularly desirable catalyst is the enzyme, horseradish peroxidase. A particularly desirable developer is the resins described in commonly assigned U.S. Pat. No. 4,647,952 which is incorporated herein by reference and more particularly the product of oxidative coupling of bisphenol A.

The phenolic developers used in the present invention may be metallated to improve their developing characteristics. They may be metallated by reaction with a salt selected from the group consisting of copper, zinc, aluminum, tin, cobalt and nickel. Most typically, the resins are zincated to improve development. The metal content of the resins generally is about 1 to 5% by weight but may range up to 15%.

Preferably developer materials such as phenol-formaldehyde condensation products are used. More particularly, alkylphenolic resins and, still more particularly, metallated products of alkylphenolic resins are used. The alkyl phenols are monosubstituted by an alkyl group which may contain 1 to 12 carbon atoms. Examples of alkyl phenols are ortho- or para- substituted ethylphenol, propylphenol, butylphenol, amylphenol, hexylphenol, heptylphenol, octylphenol, nonylphenol, t-butylphenol, t-octylphenol, etc.

Another class of thermoplastic developer material is a resin-like condensation product of a polyvalent metal salt, such as a zinc salt, and a phenol, a phenol-formaldehyde condensation product, or a phenol-salicylic acid-formaldehyde condensation product. This developer material is available from Schenectady Chemical Co. under the designation HRJ 4250 and HRJ 4252. These products are reported to be a metallated condensation product of an ortho- or para-substituted alkylphenol, a substituted salicylic acid, and formaldehyde.

It is critical that the developer materials of the present invention be present on the surface of the developer sheet as finely divided particles or microspheres. In the past, finely ground developer resins have been obtained by grinding a mixture of a developer such as a phenolic resin or a zinc salicylate with another resin and clay to produce a resin grind which is applied to the surface of the developer sheet. See, for example, U.S Pat. No. 3,924,027. This process is not desirable because fine particles of uncoalesced material remain in the coating after processing which detract from the transparency and glossiness of the layer.

Finely divided thermoplastic developer material useful in the present invention may be obtained by several processes. A developer material can be prepared in a conventional manner and a melt of the material can be atomized. Alternatively a melt of the developer material can be injected into a rapidly agitated aqueous medium whereupon the melt is solidified as droplets which are recovered. The developer material can also be dissolved in a solvent/non-solvent system and the solvent removed. Other materials such as Schenectady HRJ 4250 and HRJ 4252 resins are obtained in a dispersed form.

The developer layer may consist of thermoplastic developer material or an admixture of a thermoplastic developer material and a thermoplastic latex, or an admixture of a thermoplastic developer material and a binder having a refractive index which closely approximates or is equal to that of the melted thermoplastic developer material. (The terms "coalescable" and "thermoplastic" as used herein refer to materials which will form a film upon processing the developer layer as previously described.)

Useful oils for the oil-containing microcapsules 18 include oils conventionally used as "carrier oils" in the carbonless pressure-sensitive paper art. Useful examples include alkylated biphenyls (e.g., monoisopylbiphenyl) polychlorinated biphenyls (environmentally hazardous), castor oil, mineral oil, deodorized kerosene, naphthenic mineral oils, dibutyl phthalate, dibutyl fumerate, brominated paraffins, etc.

As indicated above, the support for the developer sheet may be transparent or opaque. In accordance with the most typical embodiments of the invention, it is paper or a synthetic film such as polyethylene terephthalate.

The developer sheet of the present invention is prepared by coating a support with a coating composition of the finely divided developer material using conventional coating techniques. The coating composition may be an aqueous suspension or emulsion of the developer. The developer material is usually applied to the surface of the support in an amount of about 8 to 15 g/m$^2$. Depending upon the nature of the developer material and how it is obtained, a binder may be necessary to adhere the developer resin to the support.

In most cases, heat or a combination of heat and pressure is used to coalesce the developer resin. In accordance with the process of the present invention, the color precursor is image-wise transferred to the developer sheet by typing in pressure-sensitive recording or by passing an exposed photosensitive imaging sheet through the nip between a pair of pressure rollers in photosensitive systems. The developer resin is subsequently coalesced, for example, by heating the developer sheet by contact with heated roller or a pair of heated rollers or by passage of the developer sheet over a heated platen. Alternatively, the developer sheet can be placed in a hot oven. In another embodiment of the image, a photosensitive imaging sheet can be assembled with the developer sheet and the color precursor can be transferred and the developer resin coalesced simultaneously by passage through a pair of heated pressure rolls. This practice is, however, sometimes undesirable because the developer resin can coalesce before there is adequate reaction of the color precursor.

Developer layers in accordance with the present invention and particularly developer layers prepared by coating aqueous suspensions or dispersions of finely divided thermoplastic developer particles on a support are particularly useful in applications such as copying microfilm or microfiche images where very high resolution is required. It has been shown that internal phase transfer to the surface of a developer sheet can be described in terms of a capillary model (Washburn equation) in which the depth of liquid penetration is proportional to the square root of both the average pore radius and the contact time between the internal phase and the capillaries defined by the spaces among the developer particles on the surface of the developer sheet. It has also been shown that resolution improves as the void volume of the developer layer increases. By controlling the particle size of the developers of the present invention, developers have been developed which provide both good capillary action and higher void volume. These developers provide the high resolution images required in microfiche or microfilm imaging or copying. Resolutions of 100 line pairs/mm have been achieved.

Having described the invention in detail and by reference to preferred embodiments thereof, it will be apparent that modifications and variations are possible without departing from the scope of the appended claims.

What is claimed is:

1. A process for forming images which comprises image-wise transferring a color precursor to the reactive surface of a developer sheet consisting essentially of a support and a layer of a finely divided thermoplastic developer material on the surface thereof, said developer material being capable of reacting with a color precursor to produce a visible image and being capable of coalescing into a thin film which imparts gloss to said image upon application of heat and/or pressure; and coalescing said developer material.

2. The process of claim 1 wherein said step of coalescing said developer material substantially completely coalesces said developer material.

3. The process of claim 1 wherein said step of coalescing said developer material only partially coalesces said developer material.

4. The process of claim 1 wherein said step of image-wise transferring said color precursor includes the steps of image-wise exposing to actinic radiation an imaging sheet incuding a support having a layer of microcapsules on the surface thereof, said microcapsules including a photohardenable or photosoftenable photosensitive composition as the internal phase and having a chromogenic material associated therewith; assembling said image-wise exposed imaging sheet with a developer sheet; and subjecting said imaging sheet to a uniform rupturing force such that said microcapsules rupture and release said internal phase in accordance with said image-wise exposure.

5. The process of claim 1 wherein said developer material has a softening point less than 200° C.

6. The process of claim 5 wherein said developer material has a particle size of about 0.5 to 25 microns.

7. The process of claim 6 wherein said developer material is a phenol-formaldehyde resin.

8. The process of claim 7 wherein said developer material is an alkylphenol-formaldehyde developer resin.

9. The process of claim 8 wherein said phenol-formaldehyde resin is metallated.

10. The process of claim 5 wherein said step of coalescing said developer sheet includes subjecting said sheet to heat or pressure.

11. The process of claim 9 wherein said resin is a phenol-salicylic acid-formaldehyde resin.

12. The process of claim 1 wherein said support is paper.

13. The process of claim 1 wherein said support is a transparent film.

14. The process of claim 6 wherein said developer material is a metallated condensation product of a phenol and formaldehyde.

15. The process of claim 14 wherein said developer material is a condensation product of a phenol, formaldehyde and a salicylic acid.

16. The process of claim 6 wherein said developer material is a product of oxidative coupling of a phenol or biphenol.

17. The process of claim 16 wherein said biphenol is bisphenol-A.

18. The process of claim 4 wherein said developer sheet consisting essentially of said support and said layer of a finely divided thermoplastic developer material on the surface thereof additionally includes microcapsules containing an oil which is capable of plasticizing said developer material such that upon assemblying said image-wise exposed imaging sheet with said developer sheet and subjecting said imaging sheet to a uniform rupturing fore, said microcapsules containing said oil are ruptured so that said oil is released and plasticizes said developer materials.

19. The process of claim 4 wherein said imaging sheet including said support having said layer of photosensitive microcapsules on the surface thereof additionally includes microcapsules containing an oil which is capable of plasticizing said developer material such that upon assembling said image-wise exposed imaging sheet with a developer sheet and subjecting said imaging sheet to a uniform rupturing force, said microcapsules containing said oil are ruptured so that said oil is released and plasticizes said developer material.

20. A process for forming images which comprises image-wise exposing to actinic radiation a photosensitive material consisting essentially of a support having a layer of a finely divided, thermoplastic, developer material on the surface thereof, said developer material being capable or reacting with a color precursor to produce a visible image and being capable of coalescing into a thin film which upon application of heat and/or pressure; and a layer of microscapsules overlying said layer of developer material, said microcapsules containing a photosensitive composition which changes in viscosity in response to exposure to actinic radiation and a color precursor; subjecting said layer of microcapsules to a uniform rupturing force such that said color precursor is image-wise released from said microcapsules to said developer material whereupon an image is formed; and coalescing said developer material.

21. The process of claim 20 wherein said support is a transparent film such that said image may be viewed through said support.

22. The process of claim 21 comprising the additional step of assembling said photosensitive material with a material which provides a white background such that said layer of said microcapsules is interposed between said transparent substrate and said material providing said white background.

23. The process of claim 20 wherein said developer resin is a phenolic resin having a softening point less than 200° C.

24. The process of claim 23 wherein said developer material is a condensation product of a phenol, formaldehyde and a salicyclic acid or a product of oxidative coupling of a phenol.

25. The process of claim 20 wherein said images are microfiche or microfilm images requiring high resolution.

26. The process of claim 20 wherein said layer of said finely divided thermoplastic developer material consists of said thermoplastic developer material, an admixture of said thermoplastic developer material and a thermoplastic latex, or an admixture of said thermoplastic developer material and a binder having a refractive index which closely approximates or is equal to that of said thermoplastic developer material when melted.

27. The process of claim 21 wherein said photosensitive material additionally includes a layer of paper overlying said layer of microcapsules such that said microcapsules are interposed between said layer of paper and said layer of said developer material.

* * * * *